US011404851B2

(12) United States Patent
Bonnin Pons-Estel

(10) Patent No.: US 11,404,851 B2
(45) Date of Patent: Aug. 2, 2022

(54) BUILDING AUTOMATION DEVICE WHICH CAN BE RECESSED IN AN ELECTRICAL BOX

(71) Applicant: ROBOT, S.A., Palma de Mallorca (ES)

(72) Inventor: Bernat Bonnin Pons-Estel, Palma de Mallorca (ES)

(73) Assignee: ROBOT, S.A., Palma de Mallorca (ES)

( * ) Notice: Subject to any disclaimer, the term of this patent is extended or adjusted under 35 U.S.C. 154(b) by 324 days.

(21) Appl. No.: 16/638,781

(22) PCT Filed: May 29, 2018

(86) PCT No.: PCT/ES2018/070387
§ 371 (c)(1),
(2) Date: Feb. 13, 2020

(87) PCT Pub. No.: WO2019/229274
PCT Pub. Date: Dec. 5, 2019

(65) Prior Publication Data
US 2020/0186380 A1      Jun. 11, 2020

(51) Int. Cl.
*H01R 13/46* (2006.01)
*H02B 1/015* (2006.01)
(Continued)

(52) U.S. Cl.
CPC .............. *H02B 1/015* (2013.01); *G05B 15/02* (2013.01); *H02B 1/40* (2013.01); *H02B 1/46* (2013.01);
(Continued)

(58) Field of Classification Search
CPC ............ H02G 3/08; H02G 3/081; H02G 3/14; H02G 3/10; H02B 1/015; H02B 1/40;
(Continued)

(56) References Cited

U.S. PATENT DOCUMENTS 5,525,754 A * 6/1996 Akins .................. H01R 4/4827
174/53
6,937,461 B1 * 8/2005 Donahue, IV ....... H01R 13/514
174/59
(Continued)

FOREIGN PATENT DOCUMENTS

WO    2008097992 A1    8/2008
WO    2016154461 A1    9/2016

OTHER PUBLICATIONS

Jan. 31, 2019 (WO) International Search Report—App PCT/ES2018/070387.
(Continued)

*Primary Examiner* — Angel R Estrada
(74) *Attorney, Agent, or Firm* — Banner & Witcoff, Ltd.

(57) ABSTRACT

The invention relates to a building automation device which can be recessed in an electrical box, which adapts to the various communication requirements, which comprises a communication module with a communication bus, an application module which implements the functionality of the device, and a bus connector between the two modules, in which said bus connector serves to supply and transfer data, the communication module comprises a first base, the application module comprises a second base, during use, second side faces of the second base are inserted into a first opening of the first base, and the first base is joined to the second base via first attachment means.

6 Claims, 6 Drawing Sheets

(51) Int. Cl.
*G05B 15/02* (2006.01)
*H02B 1/46* (2006.01)
*H02B 1/40* (2006.01)
*H02G 3/14* (2006.01)
*H05K 7/14* (2006.01)
*H04L 12/28* (2006.01)
*H04L 12/00* (2006.01)

(52) U.S. Cl.
CPC ............ *H02G 3/14* (2013.01); *H05K 7/1422* (2013.01); *H01R 13/46* (2013.01); *H04L 12/00* (2013.01); *H04L 12/2823* (2013.01)

(58) Field of Classification Search
CPC . H02B 1/46; H02B 1/42; H01R 13/46; H01R 13/502; H04L 12/00; H04L 12/2823; H04L 12/02; G05B 15/02; G05B 15/00; G05B 19/02; H05K 7/1422; H04J 13/00; Y04S 20/20; Y02B 70/30
USPC .... 174/480, 481, 50, 53, 66, 67, 50.52, 520, 174/559, 535; 220/3.2, 3.3, 4.02; 248/906
See application file for complete search history.

(56) References Cited

U.S. PATENT DOCUMENTS

| | | | |
|---|---|---|---|
| 7,273,983 B1* | 9/2007 | Rintz | F21S 8/035 174/67 |
| 7,994,436 B2* | 8/2011 | Yamamoto | H01R 25/006 361/679.01 |
| 8,158,883 B2* | 4/2012 | Soffer | H04B 3/56 361/679.01 |
| 8,415,561 B2* | 4/2013 | Gates | H01R 13/748 174/59 |
| 9,756,477 B2* | 9/2017 | Azih | H04W 4/80 |
| 10,923,896 B2* | 2/2021 | Hodges | H05K 7/1472 |
| 10,951,052 B2* | 3/2021 | Rohmer | H02J 7/0044 |
| 11,224,112 B2* | 1/2022 | Karc | H02G 3/16 |
| 2008/0244104 A1 | 10/2008 | Clemente | |
| 2016/0191268 A1 | 6/2016 | Diebel | |

OTHER PUBLICATIONS

Han Ning et al. "Research of KNX device node and development based on the bus interface module" Proceedings of the 29th Chinese Control Conference, Jul. 2010, pp. 4345-4350.

* cited by examiner

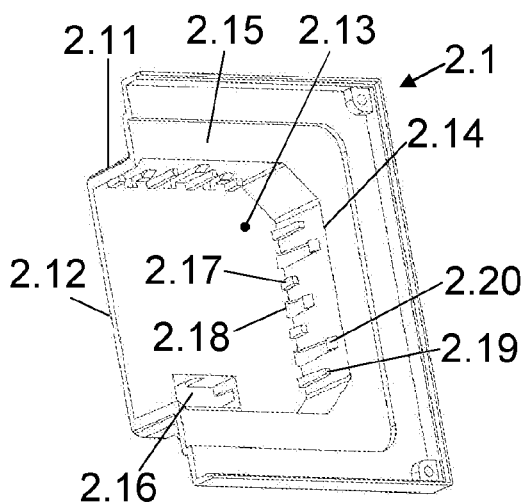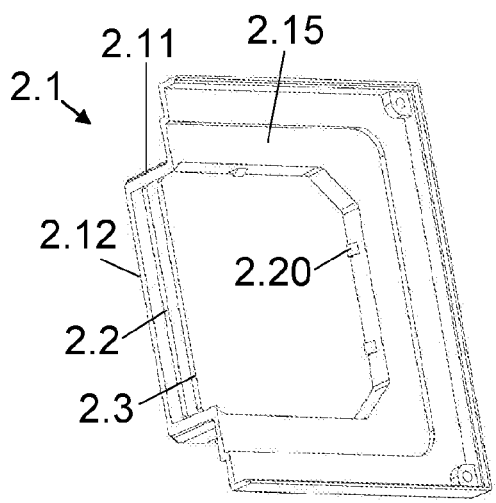
Fig.13    Fig.14
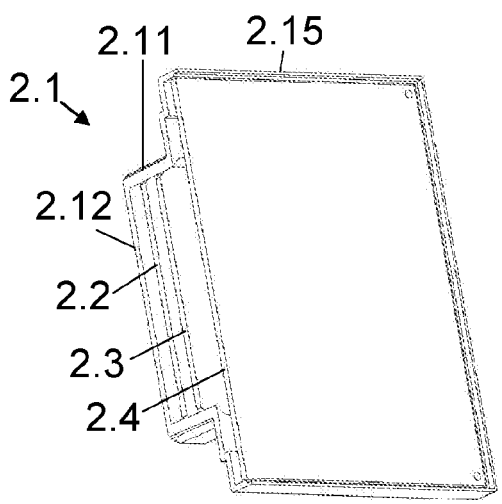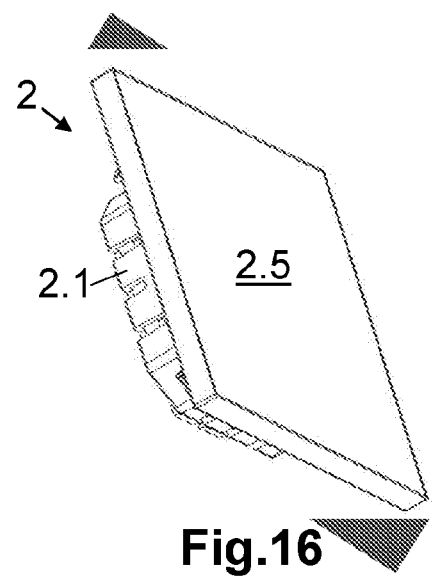
Fig.15    Fig.16
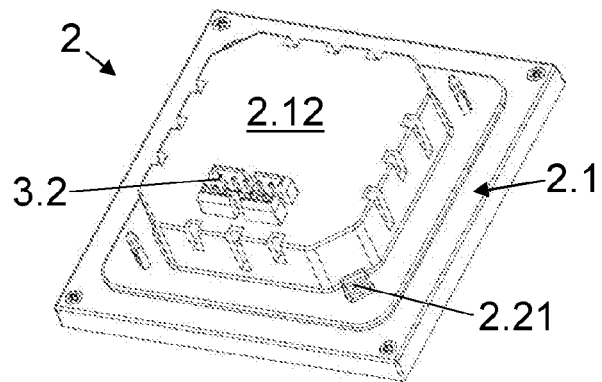
Fig.17

BUILDING AUTOMATION DEVICE WHICH CAN BE RECESSED IN AN ELECTRICAL BOX

The present application is a U.S. National Phase Application under 35 U.S.C. § 371 of PCT/ES2018/070387 filed May 29, 2018, the contents therein of the applications is incorporated by reference herein in its entirety.

FIELD OF THE INVENTION

The present invention is encompassed in the field of building automation devices, such as for example those that control lighting, blinds, air conditioning, etc., and in particular those that can be recessed, mounted, in an electrical box of the type known.

BACKGROUND OF THE INVENTION

Currently, the use of home automation and building management systems is being extended for building automation, which is done through devices with mainly electrical and electronic elements that allow the automation of certain tasks, such as lighting control, shutter control—such as the raising and lowering of blinds—the control of ambient air by means of air conditioning and heating appliances, surveillance, doorbells, etc. However, the implementation of this automation has led to the installation of many devices, which have a certain size and certain specific operating requirements, which sometimes makes them unfeasible due to their low ability to adapt to new communications, electrical and electronic requirements, like to certain supports, such as for example an electrical box of the type known (usually known as "fuse box").

Patent WO2008/097992A1 is known which explains a building automation system with modular components, which in one embodiment are of the type of attachment to a standard rail with the aim of making the system more compact, avoiding the extensive use of wiring. Advantageously, each modular component can be of the same height and depth to be arranged laterally overlapping occupying the length of the rail, in which a power bus and a data bus can be arranged, either separately or combined. It is cited that any communication protocol can be used, specifically using a modular component intended for communications.

Patent US2008/0244104A1 is known, which explains a building automation system comprising a communications adapter with the various system devices, the adapter includes a fieldbus, can operate under several protocols. The schematic configuration of the adapter and device is explained, without reflecting a specific configuration.

Patent US2016/0191268A1 is known, which explains a building automation system with devices that include functional interchangeable modules, these are configured as portions insertable from the front of each device, some modules can be communications modules including different protocols. In the configurations shown, a fuse box and a light bulb socket are included.

DESCRIPTION OF THE INVENTION

The present invention is defined and characterised by the independent claims, while the dependent claims describe additional features thereof.

The subject matter of the invention is a building automation device which can be recessed in an electrical box that adapts to the different communications requirements. The technical problem to solve is to configure said device to reach the mentioned object.

"Electrical box" intends to refer to the boxes (also known as "fuse boxes") in which the electrical devices, usually the known as electrical mechanisms, are recessed or inserted. The electrical box mentioned here refers to any of those known, usually with standard measures governed by different regulations.

In view of the foregoing, the present invention relates to a building automation device comprising a communication module (also called "MCU") having a communications bus of the device, being understood as with its exterior, either through wired or wireless network, an application module (also called "MAU") that implements the functionality of the device, i.e., it carries out the functions of the device, if it is a light switch, it will turn the lights on and off, etc., and a bus connector between the two modules, as is known in the state of the art.

The device is characterised in that said bus connector is for power supply and data transfer, the communication module comprising a first base comprising at least four first side faces, said base being closed on one of its sides by a first rear cover, creating a first cavity, leaving a first opening on the other side, the rear cover having a second opening through which the communications bus passes, at least two first protrusions, each one of them on different side faces, at least one first flange on a side face, at least two second protrusions, each one of them on different side faces, from the first opening the second protrusions are arranged upstream of the first flange and the latter upstream of the first protrusions, on the first protrusions a first printed circuit board is supported, retained by the first flange, on the second protrusions a second printed circuit board is supported to which the communications bus is connected and from which at least ten pins of the bus connector project, a first front cover with a third opening for the passage of the at least ten pins, and a support plate arranged surrounding the side faces to the vicinity of the first opening.

The device is also characterised in that the application module comprises a second base comprising at least four second side faces, said base being closed on one of its sides by a second rear cover, creating a second cavity, leaving a fourth opening on the other side, a first frame surrounding it, the second rear cover having a fifth opening, at least two third protrusions, each one of them on different side faces, at least a second flange on a side face, at least two fourth protrusions, each one of them on different side faces, at least one third flange on one side face, from the fourth opening the first frame is arranged upstream of the third flange, the latter upstream of the fourth protrusions, the latter upstream of the second flange and the latter upstream of the third protrusions, on the third protrusions a third printed circuit board is supported to which the receiving connector is connected, retained by the second flange, on the fourth protrusions a fourth printed circuit board is supported, retained by the third flange, on the first frame a fifth printed circuit board is supported.

The device is also characterised in that in use, i.e., with all its components assembled and ready to use, when the ten pins of the bus connector are introduced in the receiving connector that passes through the fifth opening, the second side faces are introduced in the first opening, and the first base is joined to the second base via first attachment means.

In short, the device consists mainly of two parts, one, second base, inserted in the other, first base, with the simplicity, modularity and adaptability that this entails.

In this way, a compact device which can be recessed in any electrical box of the type known, and also adaptable to any communications environment is achieved by simply placing the appropriate communications bus, i.e., that of the protocol necessary for the specific application. In this way a single MAU can be maintained for different applications in which the communication protocol changes, usually when changing countries, whereby only the MCU needs to be changed, with the economic and installation-related advantage that this implies. Likewise, this can be used for maintenance work in which a user does not have to be deprived of the device for a long period of time due to breakdown, for example of a sensor or user interface, since merely the MAU is to be changed, which entails only a few seconds, avoiding bus reconnection and probably reconfiguration of the device.

Another added advantage is that it allows the development of the functionalities of the devices to be independent from that of communication, by having the MAU separated from the MCU, speeding up the development of new devices or the updating of existing ones.

Another advantage is that it allows the implementation of homogeneous multiprotocol solutions.

Another advantage is that in the updating of existing installations it allows the devices of the invention to be placed gradually, being able to coexist with old devices and even with those of different manufacturers.

Another advantage is that it allows the implementation of whichever the necessary electronic components are due to the arrangement of the different printed circuit boards. Thus, in relation to the MCU, normally the first printed circuit board is suitable for housing large electronic components, for example, power supplies that include electrolytic capacitors or conventional assembly coils; the next one, the second printed circuit board allows to assemble the control electronics and the components that make up the user interface (push-buttons, selectors, LEDs, etc.). In relation to the MAU, the third printed circuit board normally houses the control electronics, especially when it does not fit on the fourth printed circuit board, it is suitable for housing components of considerable height, for example, in the case of a movement sensor the sensor element includes a Fresnel lens and a separator, the fifth printed circuit board is usually intended for the components that make up the user interface (touch zones, screens, etc.), as well as that it can support glass.

BRIEF DESCRIPTION OF THE DRAWINGS

The present specification is completed by a set of figures that illustrate a preferred embodiment and in no way limit the invention.

FIG. 13 represents a side perspective view and cross-section of a second base.

FIG. 14 represents a side perspective view and cross-section of the second base, with a third and fourth printed circuit board. In FIG. 15 a fifth printed circuit board is added.

FIG. 16 is a side perspective view of the application module. In rear perspective in FIG. 17.

DETAILED DESCRIPTION OF THE INVENTION

Figure 1:
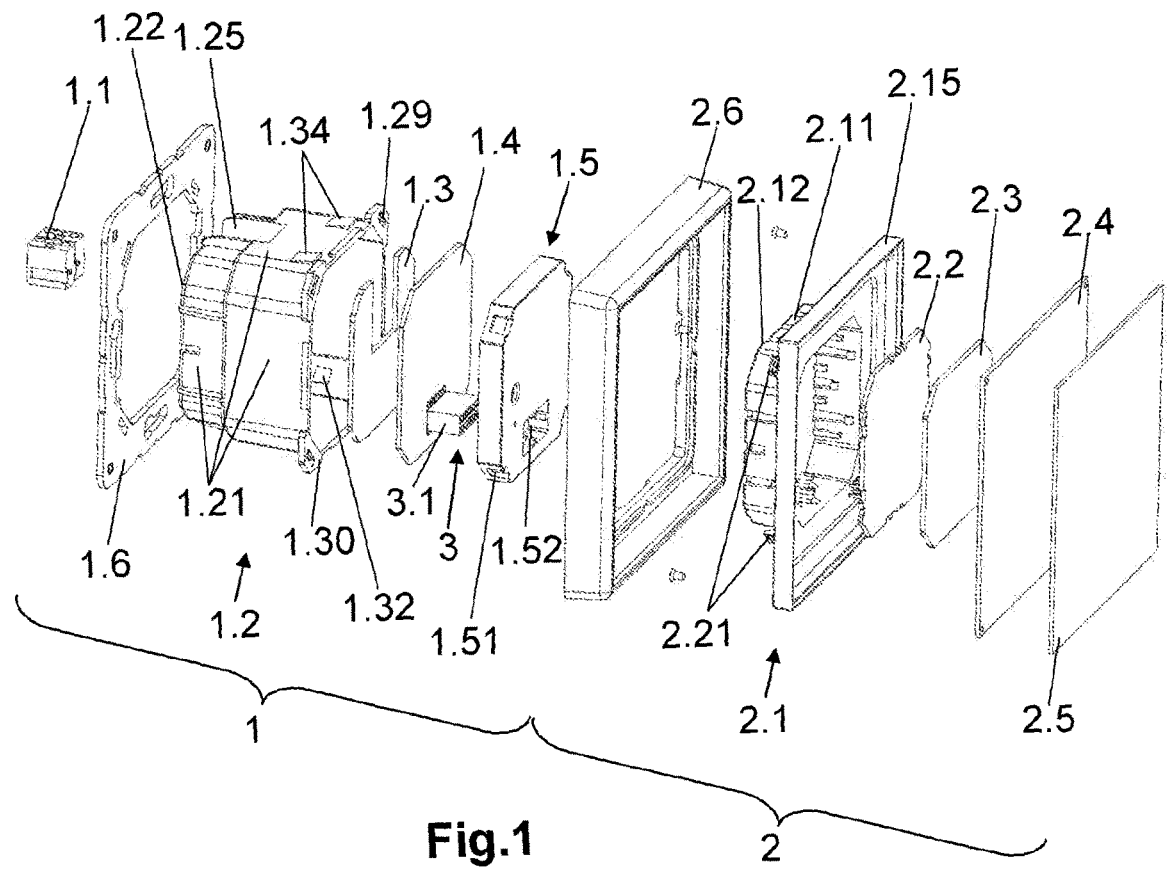
FIG. 1 represents an exploded perspective of the device.
Figure 2:
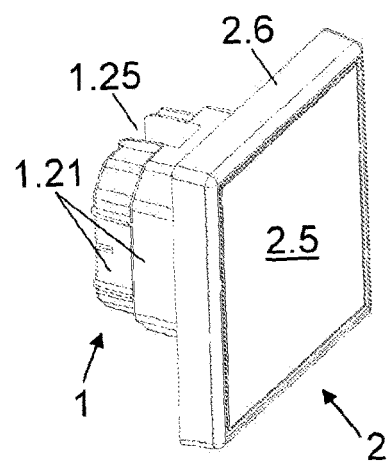
FIG. 2 represents a perspective view of the closed device, in use.
Figure 20:
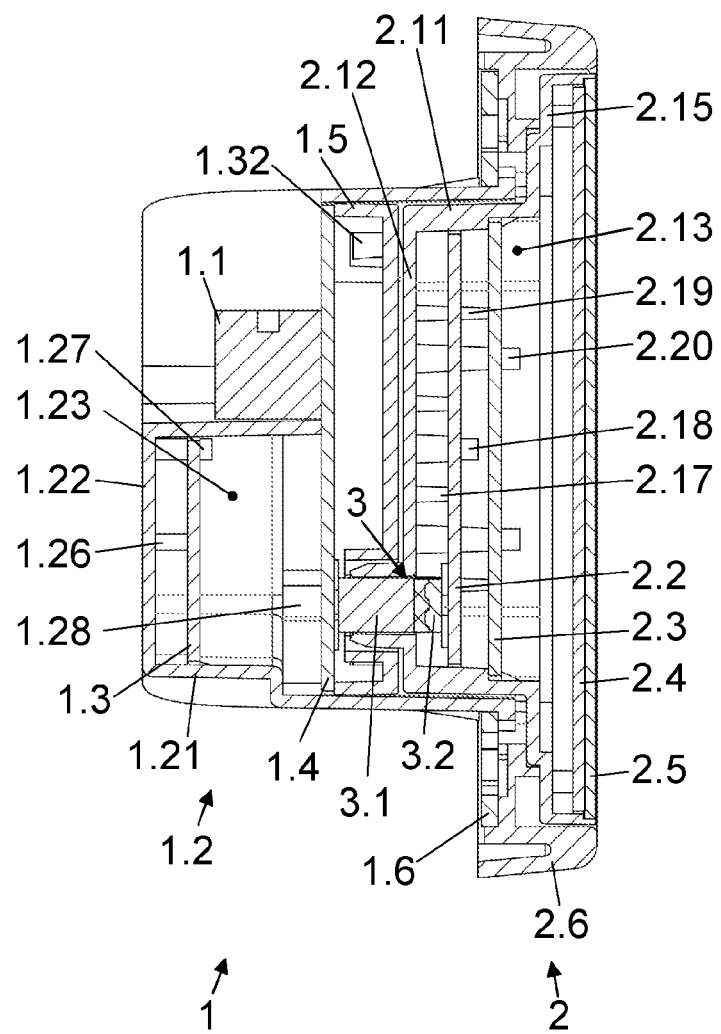
FIG. 20 is a sectional side view of the device.

The present invention is a building automation device which can be recessed in an electrical box, the latter not depicted in the figures, shown in an exploded view in FIG. 1, assembled in FIG. 2 and in a sectional view in FIG. 20.

Figure 3:
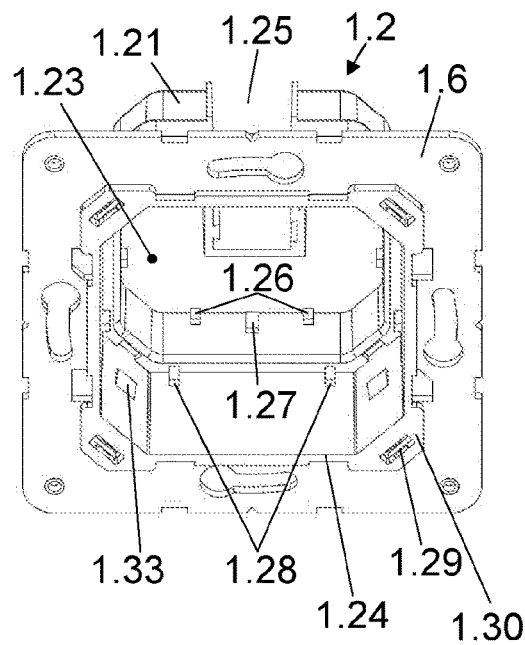
FIG. 3 represents a top perspective view of a first base with a support plate.
Figure 4:
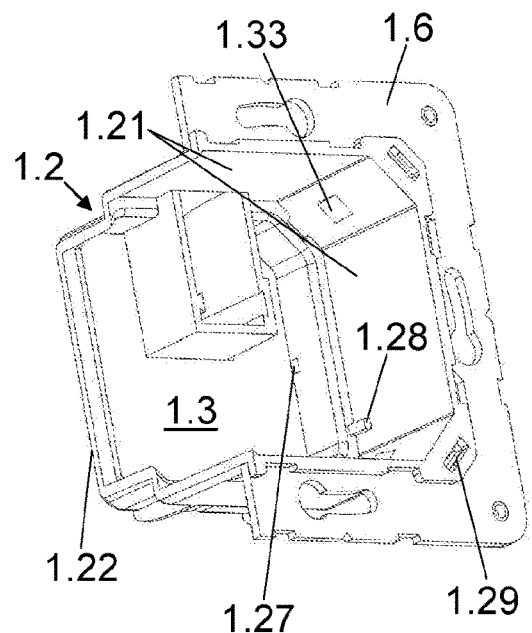
FIG. 4 represents a side perspective view and cross-section of the first base, with a support plate and with a first printed circuit board.

The building automation device, as shown in FIG. 1, comprises a communication module (1) with a communications bus (1.1) of the device, an application module (2) that implements the functionality of the device, and a bus connector (3) between the two modules (1,2), wherein said bus connector (3) is for power supply and data transfer, the communication module (1) comprising a first base (1.2) comprising at least four first side faces (1.21), closed on one of its sides by a first rear cover (1.22), creating a first cavity (1.23), leaving on the other side a first opening (1.24), FIG. 3, the rear cover (1.22) having a second opening (1.25) through which the communications bus (1.1) passes, at least two first protrusions (1.26), FIG. 3, each one of them on different side faces (1.21), at least one first flange (1.27) on a side face (1.21), at least two second protrusions (1.28), each one of them on different side faces (1.21), from the first opening (1.24) the second protrusions (1.28) are arranged upstream of the first flange (1.27) and the latter upstream of the first protrusions (1.26), on the first protrusions (1.26) a first printed circuit board (1.3) is supported, retained by the first flange (1.27), on the second protrusions (1.28) a second printed circuit board (1.4) is supported to which the communication bus (1.1) is connected and from which at least ten pins (3.1) of the bus connector (3) project, FIG. 20. In the embodiment shown two first protrusions (1.26) are arranged and between them the first flange (1.27) on each side face (1.21), as well as two second protrusions (1.28), this gives great stability to the retention of the boards (1.3, 1.4), although not strictly necessary and may be a minimum as claimed.

Figure 5:
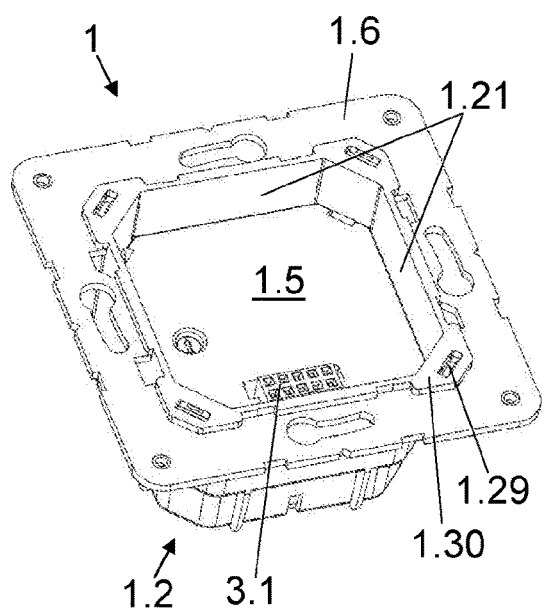
FIG. 5 represents a top perspective view of the first base, with a support plate and with a first front cover.
Figure 6:
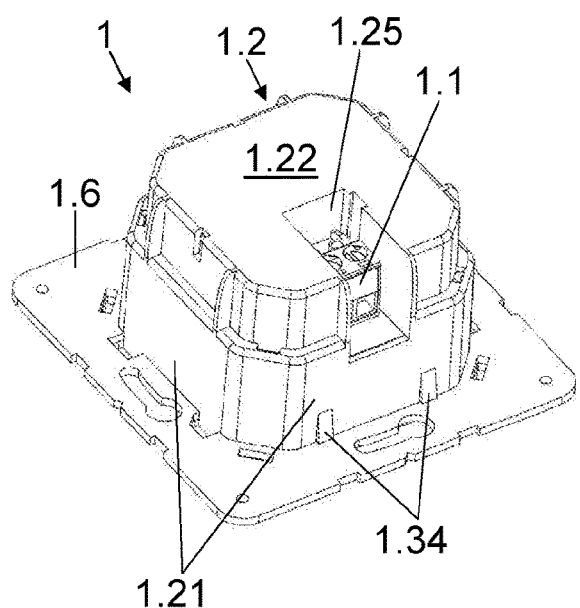
FIG. 6 represents a rear perspective view of the first base of FIG. 5.

The first base (1.2) also comprises a first front cover (1.5), FIG. 5, with a third opening (1.52), FIG. 1, for the passage of the at least ten pins (3.1). In the assembled embodiment and advantageously, the first front cover (1.5) is supported against the second printed circuit board (1.4), thus performing the retention function thereof, FIG. 20.

The first base (1.2) also comprises a support plate (1.6) arranged surrounding the side faces (1.21) to the vicinity of the first opening (1.24), FIGS. 3 to 12.

The application module (2), as shown in FIG. 1, comprises a second base (2.1) comprising at least four second side faces (2.11), closed on one of its sides by a second rear cover (2.12), creating a second cavity (2.13), leaving on the other side a fourth opening (2.14), FIG. 13, a first frame (2.15) surrounding it, integrated in the embodiment explained in the same part as the side faces (2.11), FIGS. 13 to 15, the second rear cover (2.12) having a fifth opening (2.16), at least two third protrusions (2.17), each one of them on different side faces (2.11), at least a second flange (2.18) on a side face (2.11), at least two fourth protrusions (2.19), each one of them on different side faces (2.11), at least a third flange (2.20) on a side face (2.11), FIG. 13, from the fourth opening (2.14) the first frame (2.15) is arranged upstream of the third flange (2.20), the latter upstream of the fourth protrusions (2.19), the latter upstream of the second flange (2.18) and the latter upstream the third protrusions (2.17), on the third protrusions (2.17) a third printed circuit board (2.2) is supported to which the receiving connector (3.2) is connected, retained by the second flange (2.18), on the fourth protrusions (2.19) a fourth printed circuit board (2.3) is supported by the third flange (2.20), on the first frame (2.15) a fifth printed circuit board (2.4) is supported. In the embodiment shown two third protrusions (2.17) are arranged and between them the second flange (2.18) on each side face (2.11), two fourth protrusions (2.19) and between them two third flanges (2.20) on each side face (2.11), this confers great stability to the retention of the boards (2.2,2.3), although it is not strictly necessary and can be a minimum as claimed. The fifth printed circuit board (2.4) in being supported on the first frame (2.15) has in itself a very stable position, advantageously and as shown, it can be screwed at its corners, FIGS. 13 to 15, 17, and also retained by glass (2.5) that is arranged above it, FIGS. 2, 16 and 20.

Figure 19:
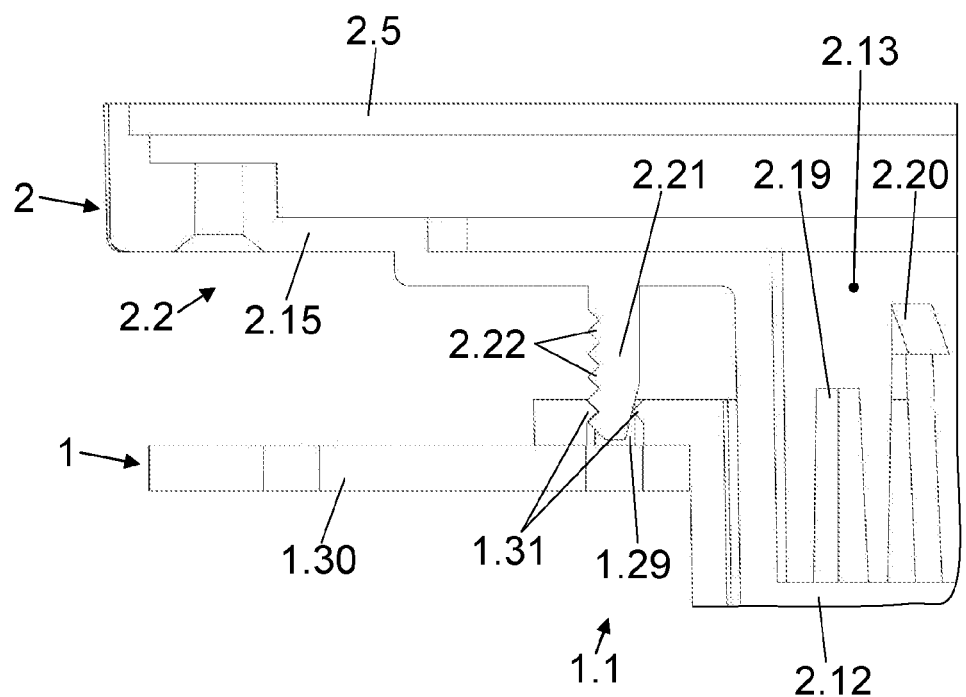
FIG. 19 is a partial sectional side view of the application module about to be assembled in the communication module.

In use when the ten pins (3.1) of the bus connector (3) are introduced in the receiving connector (3.2) that passes through the fifth opening (2.16), the second side faces (2.11) are introduced in the first opening (1.24), FIG. 20, and the first base (1.2) is joined to the second base (2.1) via first attachment means (1.29,2.21), FIG. 19 at the beginning of the introduction.

Figure 18:
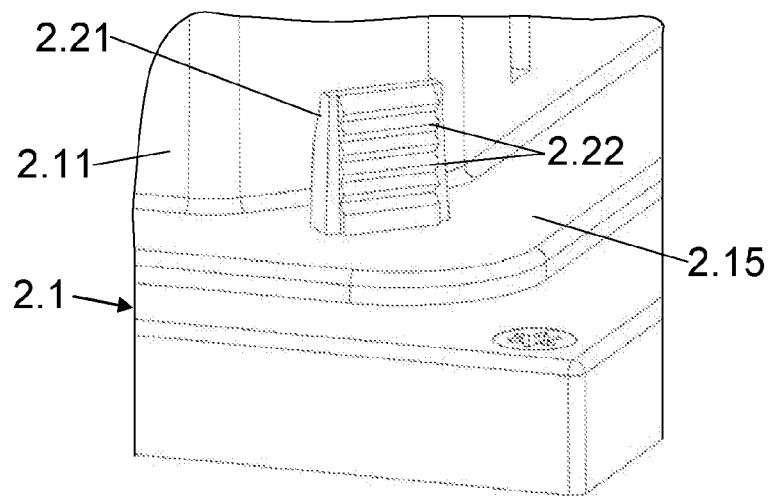
FIG. 18 is a perspective view of a detail of a fifth protrusion.

A detail of the embodiment shown is that the first attachment means comprise at least one hollow (1.29) arranged in a fourth flange (1.30), projected from the first base (1.2) and in the vicinity of the first opening (1.24), four in the embodiment shown, FIGS. 1, 3 and 19, in said hollow (1.29) at least one inner tab (1.31) is provided, two in the embodiment shown, at least a fifth protrusion (2.21) from the first frame (2.15), four in the embodiment shown, FIGS. 1, 17 to 19, and with at least one step (2.22), five in the embodiment shown, FIGS. 18, 19, so that said fifth protrusion (2.21) is inserted into the hollow (1.29) and retained by the step (2.22) abutting the inner tab (1.31). It is a simple attachment, adjustable by the variety of steps (2.22) and reversible.

Another detail of the embodiment shown is that the first front cover (1.5) is attached to the first base (1.2) by second attachment means (1.32, 1.51), which comprise at least a first ramp (1.32) arranged in one of the first side faces (1.21) and starting from its area closest to the first opening (1.24), at least one depression (1.51) in the front cover (1.5) in which said ramp (1.32) is housed, four of each one of these attachment means in the embodiment shown, FIGS. 1, 3 to 5. This configuration ensures simple insertion and safe and reversible retention.

Another detail of the embodiment shown is that above the fifth printed circuit board (2.4) a glass (2.5) is arranged, supported thereon and/or on the first frame (2.15), FIG. 20. In the embodiment shown, the first frame (2.15) has a depression, not indicated in the figures, where the glass (2.5) is supported and it is of such dimension that it is also supported on the fifth printed circuit board (2.4), thereby also serving as retention thereof.

Another detail of the embodiment shown is that the support plate (1.6) is attached to the first base (1.2) via third attachment means (1.34,1.30), FIG. 1, which comprise at least a second ramp (1.34) arranged on at least one of the first side faces (1.21), two per each side face (1.21) in the embodiment shown, and which starts from its area furthest from the first opening (1.24) and the fourth flange (1.30), so that the support plate (1.6) is arranged between the second ramp (1.34) and the fourth flange (1.30). In the embodiment shown in addition to the fourth flanges (1.30) as such, it can be seen in the figures that a wall smaller in height runs between them, not numbered in the figures, and which advantageously allows to increase the retention area of the support plate (1.6).

One option is that the support plate (1.6) is made of fibreglass. Traditionally this type of support plate is made of steel with the main drawback that they rust in humid climates. The fibreglass prevents rusting and provides a degree of flexibility that prevents deformations due to misuse by twisting or flexing the device excessively.

Another option is that a second trim frame (2.6) can be arranged surrounding the device, supported on the first frame (2.15) in the embodiment shown, FIGS. 1, 2 and 20.

In the embodiment shown, the first (1.2) and second base (2.1) show the chamfered side faces (1.21.2.11), each chamfer is considered as being part of a side face. For simplicity in the description these chamfer faces have not been named as they are an option and may or may not be included.

Figure 7:
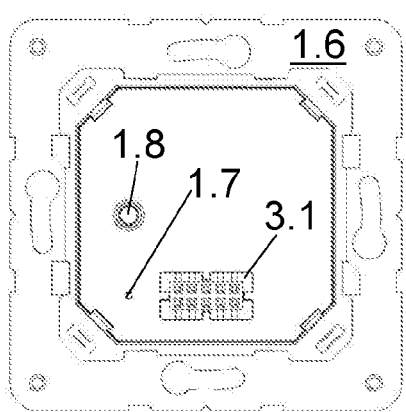
FIGS. 7 to 12 represent front views, alternated with rear views, of the first base, with a support plate and with a first front cover, for different communication buses.

Preferably, the communication module (1) has a first LED indicator (1.7) and a first push-button (1.8), which allow the user to interact and parameterise some functions of the device, FIG. 7.

Figure 8:
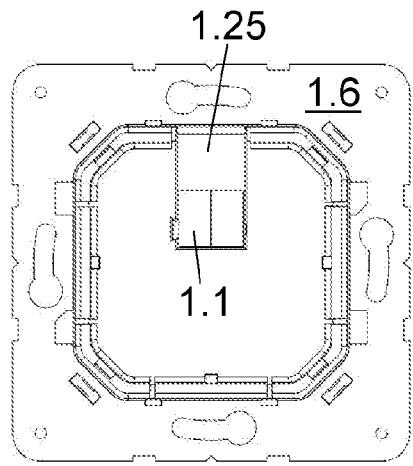
Figure 10:
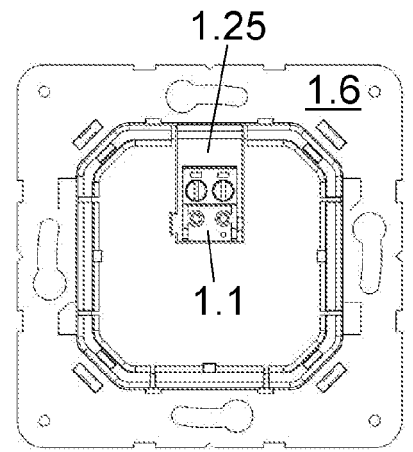
Figure 12:
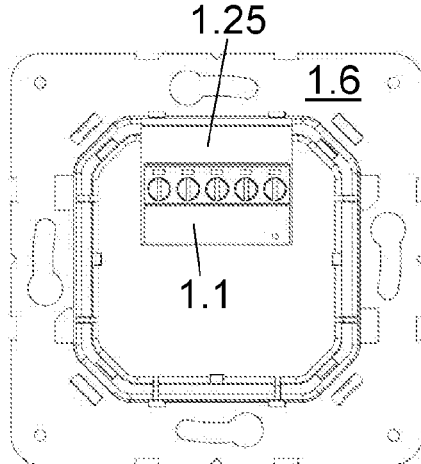

Advantageously, the second opening (1.25) is adapted for receiving the communications bus (1.1) according to one of the protocols selected from among KNX, C3, C4 and BACnet as shown respectively in FIGS. 8, 10 and 12.

Figure 9:
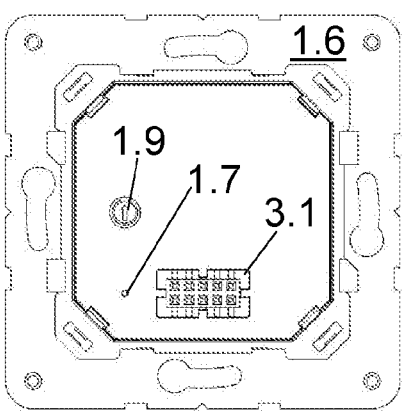

Specifically, for KNX and C3/C4, FIGS. 7 and 9, the same second opening (1.25) serves the purpose, FIGS. 8 and 10. For KNX, FIG. 7, the first status LED indicator (1.7) and the first programming push-button (1.8) are incorporated as a user interface, while for C3/C4, FIG. 9, a rotary selector (1.9) is incorporated for the address assignment and a first status LED indicator (1.7).

Figure 11:
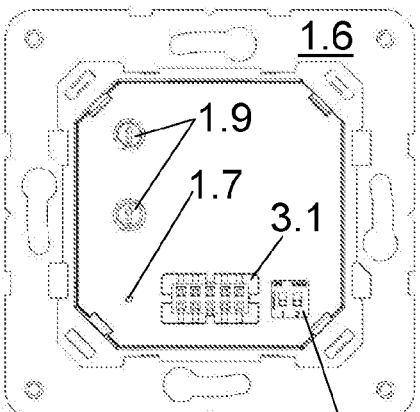

On the other hand, for BACnet, FIG. 11, the second opening (1.25), FIG. 12, is larger than the previous one, since it goes to five terminals from two. This is due to the insurmountable differences that exist in terms of the user interface. The configuration for BACnet incorporates two rotary selectors (1.9) for address assignment, a first status LED indicator (1.7), and a "DIP switch"-type double selector (1.10), FIG. 11, with which to adjust the transmission speed.

The invention claimed is:

1. A Building automation device which can be recessed in an electrical box, comprising a communication module with a communications bus of the device, an application module that implements the functionality of the device, and a bus connector between the two modules, characterised in that said bus connector is for power supply and data transfer, the communication module comprising a first base comprising at least four first side faces, closed on one of its sides by a first rear cover, creating a first cavity, leaving on the other side a first opening, the rear cover having a second opening through which the communications bus passes, at least two first protrusions, each one of them on different side faces, at least one first flange on one side face, at least two second protrusions, each one of them on different side faces, from the first opening the second protrusions are arranged upstream of the first flange and the latter upstream of the first protrusions, on the first protrusions a first printed circuit board, retained by the first flange is supported, on the second protrusions a second printed circuit board is supported to which the communication bus is connected and from which at least ten pins of the bus connector project, a first front cover with a third opening for the passage of the at least ten pins, a support plate arranged surrounding the side faces to the vicinity of the first opening, the application module comprising a second base comprising at least four second side faces, closed on one of its sides by a second rear cover, creating a second cavity, leaving on the other side a fourth opening, a first frame surrounding it, the second rear cover having a fifth opening, when at least two third protrusions, each one of them on different side faces, at least one second flange on one side face, at least two fourth protrusions, each one of them on different side faces, at least one third flange on one side face, from the fourth opening the first frame is arranged upstream of the third flange, the latter upstream of the fourth protrusions, the latter upstream of the second flange and the latter upstream of the third protrusions, on the third protrusions a third printed circuit board is supported to which the receiving connector is connected, retained by the second flange, on the fourth protrusions a fourth printed circuit board is supported retained by the third flange, a fifth printed circuit board is supported on the first frame, in use when the ten pins of the bus connector are introduced in the receiving connector that passes through the fifth opening, the second side faces are introduced in the first opening, and the first base is joined to the second base via attachment means.

2. The Device according to claim 1 wherein the first attachment means comprise at least one hollow arranged in a fourth flange projected from the first base and in the vicinity of the first opening, in said hollow there is at least one inner tab, at least a fifth protrusion from the first frame and with at least one step, so that said fifth protrusion is inserted into the hollow and retained by the step abutting the inner tab.

3. The Device according to claim 1 wherein the first front cover is attached to the first base by second attachment means, which comprise at least a first ramp arranged on one of the first side faces and starting from its area closest to the first opening, at least one depression in the front cover in which said ramp is housed.

4. The Device according to claim 1 wherein glass is placed above the fifth printed circuit board and/or the first frame.

5. The Device according to claim 1 wherein the support plate is attached to the first base by third attachment means comprising at least one second ramp arranged on at least one of the first side faces and starting from its area furthest away from the first opening and the fourth flange, so that the support plate is arranged between the second ramp and the fourth flange.

6. The Device according to claim 1 wherein the support plate is made of fibreglass.

* * * * *